July 4, 1950 B. S. VILKOMERSON 2,513,763

LOCKED-IN OSCILLATOR CIRCUIT

Filed Jan. 4, 1945 2 Sheets-Sheet 1

INVENTOR.

BENJAMIN S. VILKOMERSON.

BY H. S. Grover

ATTORNEY.

July 4, 1950 B. S. VILKOMERSON 2,513,763

LOCKED-IN OSCILLATOR CIRCUIT

Filed Jan. 4, 1945 2 Sheets-Sheet 2

INVENTOR.
BENJAMIN S. VILKOMERSON.
BY
H. S. Grover
ATTORNEY.

Patented July 4, 1950 2,513,763

UNITED STATES PATENT OFFICE 2,513,763

LOCKED-IN OSCILLATOR CIRCUIT

Benjamin S. Vilkomerson, Camden, N. J., assignor to Radio Corporation of America, a corporation of Delaware Application January 4, 1945, Serial No. 571,222

13 Claims. (Cl. 250—20)

My present invention relates generally to locked-in oscillator circuits, and more particularly to improved locked-in oscillators of the frequency divider type.

In his U. S. Patent No. 2,356,201, granted August 22, 1944, George L. Beers has disclosed and claimed a frequency modulation signal receiving system in which the frequency variation or swing corresponding to a predetermined percentage modulation of the received signal is reduced prior to demodulation and reproduction of the signals. In the embodiment of the invention which Beers described, demodulation was effected by a discriminator-rectifier network which converted frequency variations into amplitude variations prior to detection. The Beers system specifically provided a frequency modulation signal receiving system in which the frequency variation of the received signal was reduced by a predetermined ratio, such as 5 to 1, before demodulation, and further provided an improved frequency modulation signal receiving system inherently responsive to frequency variations over a limited range only.

A receiving system constructed in accordance with the Beers patent may include means for heterodyning a received frequency modulated carrier wave, or signal, to produce a corresponding intermediate frequency wave modulated over a range of frequencies. The latter is applied by Beers to an oscillator which is locked in with the frequency modulated wave over a range of frequency variations including, and preferably substantially limited to, the range of frequencies of the modulated wave. The output of the oscillator is fed to a discriminator network. The locked-in oscillator is important in carrying out the objects of improved noise reduction and improved adjacent channel selectivity. The only signal which reaches the discriminator is that represented by the frequency variations of the oscillations produced by the locked-in oscillator. By designing the oscillator so as to lock in only over a frequency swing substantially limited to the range of frequencies of the desired modulated wave, the oscillator was prevented from shifting its frequency sufficiently to lock in with interfering frequencies outsde of such range or with an undesired signal on an adjacent channel. The locked-in oscillator produced voltages at sub-harmonics or sub-multiples of the frequencies of the intermediate or other supplied modulated wave, and the oscillator was coupled to selective circuits in the discriminator network which were responsive to the band of sub-multiple frequencies produced by the oscillator. The receiver of the Beers patent employed on off-resonance discriminator circuit of the kind shown in the U. S. Patent to John D. Reid, No. 2,341,240, granted February 8, 1944. Beers further showed how a reactanec tube may be used to extend the lock-in range.

In the practical operation of a receiver of the type shown by Beers for the reception of a frequency modulated (FM) wave which, in accordance with present standards of frequency modulation broadcast transmission, may have an intended frequency swing up to 150 kilocycles (kc.) per second, I believe it to be desirable to provide a minimum lock-in range at the locked-in oscillator of the order of ±125 kc. This provides tolerance for mis-tuning by the user, frequency drift in the receiver circuits, over-modulation of the FM transmitter, etc., and thereby enables the locked-in oscillator circuits better to follow the received wave under such conditions.

One of the main objects of my present invention is to provide a locked-in oscillator system, particularly for frequency modulation receivers, which provides increased sensitivity and is capable of securing an extended lock-in range with relatively weaker signal voltages and without requiring the use of a reactance control tube or critically-adjusted off-resonance discriminator circuits. Preferably, a lock-in range of ±125 kc. or more is provided by a locked-in oscillator system which feeds its output energy to a frequency modulation detector whose discriminator circuit is tuned to the mean frequency of the applied frequency modulation signals.

Specifically, I utilize cascaded locked-in oscillators, provided either by separate tubes or by a single tube, which function to provide the desired subharmonic frequency energy in a series of different frequency divisions. For example, instead of, as in the Beers system, using the fifth subharmonic of the operating intermediate frequency (I. F.) to lock in an oscillator operating at the subharmonic frequency, in my arrangement a first oscillator is locked in at a small order subharmonic frequency, and the output of the first oscillator is used to lock in a second oscillator operating at a higher order subharmonic frequency. Specifically, whereas Beers secures a frequency division of 5:1 by tuning the oscillator to the fifth subharmonic of the input I. F. energy, in my circuits the first oscillator is tuned to the second subharmonic of the I. F. for lock-in, and the second subharmonic energy of the first oscillator is used to lock in the second oscillator at the third subharmonic frequency thereof. The resulting third subharmonic oscillator energy (whose sixth harmonic is the I. F.) is detected with use of a simple discriminator circuit of the type generally related to the detector shown by S. W. Seeley in his U. S. Patent No. 2,121,103, granted June 21, 1938.

Wherever the term "frequency modulation" is used throughout the present description and claims, it should be understood to refer to any modulation where the instantaneous frequency of the transmitted waves is varied by the application of modulating voltage of an alternating character such as music or speech. There are many possible functional relations between the instantaneous wave frequency and the modulating voltage which are, or can be, used. For example, if the instantaneous frequency is caused to shift in direct proportion to the instantaneous value of the modulating voltage, there results one common form of frequency modulation, or if the instantaneous frequency is caused to vary as the time integral of the modulating voltage there results a type of frequency variation, which is usually called phase modulation because it is with equal correctness, and somewhat more simply, definable as a modulation which causes the phase of the transmitted waves to shift in direct proportion to the instantaneous value of the modulating voltage. In other words, the terms "phase modulation" and "frequency modulation" are tied together by the fact that a changing frequency necessitates a changing phase, and vice versa. Furthermore, in many practical systems going under the name of frequency modulation (FM), the instantaneous frequency does not vary directly as the voltage of the modulating voltage, nor yet as its integral, but in some intermediate fashion. Regardless of the exact nature of the functional relation mentioned above, however, the system of the present invention can be employed, and hence such terms as "frequency modulation," "frequency modulated," and the like should be taken in the broad sense here defined. The generic term "angle modulation" comprehends frequency or phase modulations, or the aforesaid hybrid combinations thereof.

Still other features and objects will best be understood by reference to the following illustrative description taken in connection with the drawings in which I have indicated diagrammatically several circuit organizations whereby my invention may be carried into effect.

Figure 1:
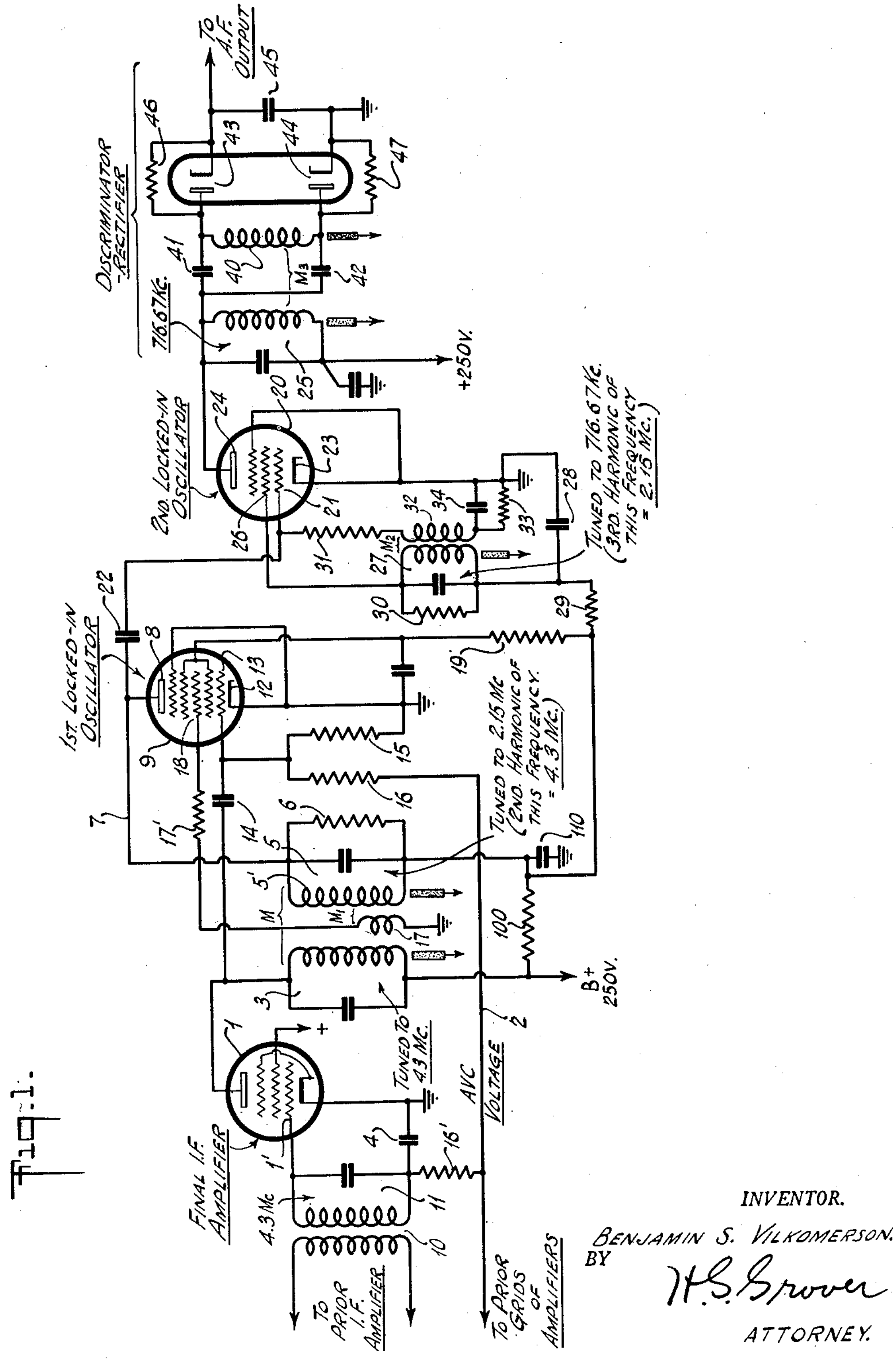
Fig. 1 is a circuit diagram which illustrates one form of a frequency modulation signal receiving system embodying the invention.

Referring to the accompanying drawings, wherein like reference characters in the different figures designate similar circuit elements, the signal input circuits of my receiving system may be of any suitable type. As is well known to those skilled in the art of FM reception the receiver may employ a tunable radio frequency amplifier, a first detector, a local oscillator and an intermediate frequency (I. F.) amplifier of the usual superheterodyne type of vacuum tube receiver circuit. A conventional dipole antenna may be used as a suitable collector of signals for the tunable radio frequency amplifier. As shown, the intermediate frequency amplifier is provided with an output transformer 10 having primary and secondary circuits each resonant to the operating intermediate frequency. The primary and secondary circuits of transformer 10 are suitably coupled, and any suitable means may be associated with the secondary circuit 11 to give the transformer 10 a resonance curve of the desired breadth. In the present example, the I. F. value may be assumed to be 4.3 mc. (megacycles), and the transformer 10 is designed to pass the frequency band occupied by the modulated carrier wave with 100% modulation, plus the necessary tolerance for mis-tuning, frequency drift of receiver circuits, etc. For the frequency modulation broadcasting standards in use at the present time, the input circuits of the receiving system, including the intermediate frequency transformer 10 with its secondary circuit 11, may be made responsive over a range of frequencies of 200 to 250 kc. for reception of a carrier wave with a total intended frequency swing of the order of 150 kc.

It will be understood by those skilled in the art of radio communication that the circuits prior to transformer 10 are provided with the usual variable tuning means. The input circuits of the radio frequency amplifier and first detector are each, in the case assumed above, tuned to the mean or center frequency of the desired station channel. The local oscillator is concurrently tuned to an oscillation frequency differing from said mean frequency by the value of the desired intermediate frequency. The present FM broadcast band is 40 to 50 megacycles (mc.), with each transmitter station allotted a channel width of 200 kc.

The I. F. signal energy developed at transformer secondary circuit 11 is amplified by the final I. F. amplifier tube 1 which is depicted as a pentode type tube. The present invention is not limited to that particular type of tube. The low potential side of input circuit 11 is preferably returned to ground by the AVC (automatic volume control) lead 2. The plate circuit of tube 1 includes the resonant circuit 3 tuned to the operating I. F. value, which may conventionally be 4.3 mc. The plate voltage supply lead is connected to the B+ terminal, say at +250 volts, of a suitable direct current source. The signal return path to the grounded cathode of tube 1 is through condenser 4. The tuned circuit 3 is inductively coupled, as indicated at M, to the resonant circuits 5 and 17. The circuit 5 is tuned to a frequency of 2.15 mc., this value being the second subharmonic, i. e. one-half, of the I. F. value. Resistor 6 in shunt with circuit 5 acts to broaden its tuning thereby making it easier for the circuit to oscillate at frequencies other than that determined by the LC product. This helps increase lock-in range and sensitivity, in that it reduces the minimum value of signal strength required for a given lock-in range. The high alternating potential side of circuit 5 is connected by lead 7 to the plate 8 of the first locked-in oscillator tube 9.

The tube 9 is schematically represented as being a pentagrid converter type of tube, although there may be employed any tube capable of generating oscillations at the required subharmonic frequency of 2.15 mc. The plate 8 is established at a suitable positive voltage by connecting the low potential side of circuit 5 to the B+ terminal through resistor 100. Resistor 100 and condenser 110 form a filter to keep the 2.15 mc. oscillator voltage out of the common B+ supply. Condenser 110 establishes the low potential side of circuit 5 at ground potential for 2.15 mc. oscillations. The cathode 12 of tube 9 is grounded, while the first grid 13 is connected through direct current blocking condenser 14 to the plate side of tuned circuit 3. Grid return resistor 15 connects signal input grid 13 to the grounded cathode. The resistor 15, furthermore, functions to develop thereacross a direct current voltage by virtue of grid current which is caused to flow in response to the impression of signals on the grid.

The control grids of prior signal transmission tubes, as grid 1' of tube 1, are connected by lead 2 to the grid end of resistor 15. Suitable filter resistors 16, 16' are inserted in the AVC line to prevent the application upon the controlled grids of alternating voltages. The AVC circuit functions in the usual and well understood manner to prevent overloading of the grid 13. Strong local signals, unless compensated for by AVC, may act to develop signal voltages at grid 13 large enough to cause the oscillator to stop oscillating and to act as an I. F. amplifier.

The local oscillations of 2.15 mc. mean frequency are produced constantly by virtue of the inductive coupling $M_1$ between the oscillator grid coil 17 and oscillator anode coil 5'. For best results coils 17 and 5' are closely coupled. The oscillator grid 18 is the third grid from the cathode, and is connected to the ungrounded end of coil 17. Resistor 17', in circuit with electrode 18, acts to prevent the oscillator from oscillating at a frequency determined by the grid circuit L (inductance) and C (capacity) constants instead of the plate circuit L and C constants. The grid 18 is surrounded by a positive electrostatic field established by the second and fourth grids of the tube. The latter grids are connected through voltage-reducing resistor 19 to the B+ terminal to provide a suitable positive operating voltage for them. It will be seen that the electron stream flowing from cathode 12 to plate 8 is subjected to control by both of grids 18 and 13.

Magnetic coupling, indicated by M on the drawing, is provided between circuit 3 and circuit 5. This coupling is sufficiently close so that by virtue of the tight coupling between coils 17 and 5', circuit 3 may be considered as coupled also to coil 17. It has been found that suitable magnitude and sense of the coupling between tuned circuits 3 and 5 will cause the oscillator to lock in with about half as much signal input as that required when no magnetic coupling is used. If the coupling is in the opposite sense, the signal input required for a given lock-in range is increased to several times that required with no such magnetic coupling. Without desiring to be limited to any particular theoretical explanation of the electrical actions involved, it is pointed out that the second harmonic component of the oscillations generated in tuned circuit 5 is of the same frequency as the signals in tuned circuit 3.

Suitable phase relationships tend to be maintained by the lock-in action, and it may be considered that in the condition of greatest lock-in range the second harmonic content of the oscillations in circuit 5, picked up by circuit 3, is fed back regeneratively through condenser 14 to grid 13 in phase with the incoming signal voltage thereby improving the lock-in action. Also, the 4.3 mc. signal voltage induced into coil 17 from circuit 3 is then impressed on grid 18 in phase with the voltage impressed on grid 13 by condenser 14. This gives additional change in plate current with signal voltage, and, hence, better lock-in action, the equivalent of using a tube of higher gm (transconductance).

The locked-in oscillator circuit associated with tube 9 functions in much the same manner as described in the aforesaid Beers patent, except that the frequency step-down ratio in this case is different, and there is employed an additional coupling between the locked-in oscillator and the signal source as explained above. Although other suitable language may be used to explain the functions of the locked-in oscillator, the following brief explanation is believed to be appropriate. Oscillator plate current pulses are modified in both amplitude and timing by "slugs" of space current controlled by the signal frequency at grid 13. These added plate current "slugs," if they are nearly (but not exactly) in phase with the plate current pulses produced by the oscillating circuit, either accelerate or retard the oscillator frequency thereby locking it in with the signal frequency, so that at any instant the oscillator frequency is one-half of the signal frequency and the change in oscillator frequency is one-half of the change in signal frequency.

Hence, at 100% modulation the total frequency change of the 2.15 mc. oscillations in circuit 5 is 75 kc., as compared with the 150 kc. change in circuit 3. For example, if at any instant the received signal has been heterodyned to an intermediate frequency of 4.375 mc. (up 75 kc. from the mean or center frequency of 4.3 mc.) the frequency of the locked-oscillator will then be 2.1875 mc. (up 37.5 kc. from the mean sub-multiple frequency of 2.15 mc.) thereby preserving the 2:1 ratio in frequency. Thus, there occurs in the circuit 5 a frequency deviation from the mean frequency of ±37.5 kc. for full modulation, assuming that the applied signal has a maximum frequency deviation of ±75 kc.

The diminished frequency step-down ratio used in each frequency division stage of the cascaded system of my invention contributes to the relatively greater lock-in range secured. In the aforesaid Beers system, wherein a 5:1 division ratio is used, part of the positive half of every fifth cycle of signal voltage affects and controls the locked-in oscillator. In my system every second signal voltage peak affects the first locked-in oscillator 9 thereby giving greatly increased control of the oscillator frequency by the signal frequency. Using 2:1 division, lock-in ranges of 350 to 400 kc. have been secured using a discriminator of the type shown in the aforesaid Seeley patent with a 6SA7 type tube.

The output of oscillator 9 is fed to a second oscillator tube 20, shown by way of example as being of the pentode type, whose signal input grid 21 is connected by direct current blocking condenser 22 to plate 8. Hence, FM oscillator energy of mean frequency 2.15 mc., is applied to grid 21. Tube 20 may be of any other suitable type. The cathode 23 is grounded, while plate 24 may be connected to a +250 volts point on the power supply. The plate circuit includes the parallel resonant circuit 25 tuned to 716.67 kc., i. e. the third subharmonic frequency of 2.15 mc. Circuit 25 is the primary circuit of the discriminator section of the FM detector.

The second grid 26 of tube 20 functions as the anode of the oscillator section of the tube, and is connected to the high alternating potential side of resonant tank circuit 27 which, in the case assumed, is also tuned to 716.67 kc. The low potential side of tank circuit 27 is returned to ground for alternating currents by means of the bypass condenser 28, while it is returned to the B+ terminal through voltage-reducing resistor 29. Resistor 30 shunts tank circuit 27 to broaden the response curve thereof, for reasons more fully explained in connection with resistor 6. Control grid 21 of tube 20 is returned to the grounded cathode through a direct current path which comprises resistor 31, coil 32 and resistor 33. Resistor 31 is a suppressor resistor, and acts to keep the oscillator from oscillating at a frequency determined by the grid circuit L and C constants instead of the plate circuit L and C constants. Resistor 33 is a grid leak resistor for oscillator bias.

Coil 32 is magnetically and closely coupled to the tank circuit 27 as indicated at $M_2$. Resistor 33 is shunted by condenser 34 so as to establish the lower end of coil 32 at ground potential for alternating currents. The coupling $M_2$ is so chosen that the oscillator electrodes 23, 21 and 26 of the tube, under the control of tank circuit 27, provide local oscillations at the predetermined mean frequency of 716.67 kc. The application of the first locked-in oscillator energy, whose mean frequency is 2.15 mc., to grid 21 causes the third sub-harmonic oscillations thereof to be locked in with the applied FM energy.

Though it is not essential, for convenience circuits 3 and 5, as well as all other resonant circuits in the disclosed embodiment of my invention, employ variable magnetic core inductances.

For reasons more fully explained in connection with the first locked-in oscillator 9, the mean frequency of the oscillations produced by tube 20 is not only one-third of the frequency applied to grid 2, but the frequency swing of such oscillations is also one-third that of the applied energy. In other words, the frequency deviation from the mean frequency of the FM wave energy appearing at output circuit 25 is ±12.5 kc. It will, therefore, be seen that between the input circuit 11 and the output circuit 25 there has occurred a frequency division down to one-sixth of the initial intermediate frequency, with concurrent reduction of the total frequency change by the same factor of 6.

The reasons for using cascaded 2:1 and 3:1 divisions are various. For one thing, a system using 2:1 division and 3:1 division, which gives an overall frequency division of 6:1, is a system using small integral steps, hence affording great sensitivity. There are several other advantages which accrue with the present two-stage method. By proper choice of the circuit constants of the locked-in oscillators 9 and 20, and in particular of the coupling between the circuits of the individual oscillators and the operating potentials applied to the tube electrodes, their output voltages can be made substantially independent of the amplitude of the signal voltages impressed upon them. More specifically, the output of the first oscillator is nearly constant despite variations in the strength of the received signals, and by impressing its almost uniform output upon the second oscillator a very high degree of constancy of amplitude of the voltages impressed on the ultimate discriminator is obtained.

Another advantage is gained in that the first oscillator can be made relatively weak, and the second oscillator strong. This is desirable as the strong second oscillator feeding the discriminator gives good audio frequency output, whereas greater lock-in sensitivity may be obtained with a weak first oscillator. By adjusting the coupling between the two locked-in oscillators, the lock-in sensitivity of the second locked-in oscillator can be readily controlled to make the system responsive to the band width covered by the first oscillator. It is desirable that the strong oscillator which drives the discriminator operate on a frequency well removed from that of the I. F. amplifier thereby minimizing the stability problem. In the embodiment of my invention described herein, I. F. feedback from the second locked-in oscillator will be had only from a relatively weak higher-order harmonic, the 6th, rather than strong low-order harmonics. The low-order (2nd) harmonic I. F. feedback from the first locked-in oscillator is weak because the fundamental oscillator output is relatively weak.

One of the important advantages of my present invention resides in the fact that there may readily be utilized an FM detector circuit of the aforementioned Seeley type. As is well known to those skilled in the art, this type of detector circuit employs a discriminator section whose tuned circuits are resonated to the desired mean frequency of the applied FM energy. In accordance with the present invention, the nature of the discriminator circuits has substantially no effect on the lock-in range of the locked-in oscillator system. Hence, it is unnecessary to employ discriminator circuits which are inherently critically misaligned relative to the mean frequency of the output of the second locked-in oscillator tube.

The discriminator-rectifier network shown herein is that disclosed and claimed by W. R. Koch in his application Serial No. 529,074, filed April 1, 1944, now Patent No. 2,410,983 granted Nov. 12, 1946. Since the discriminator-rectifier circuit is not a part of the present invention, it is not believed necessary to describe it in detail. It is sufficient for the purposes of this application to point out that the primary circuit 25 is inductively coupled, as at $M_3$, to the secondary coil 40. The latter is tuned by the condensers 41 and 42, which are connected in series-shunt across coil 40, to the same frequency to which circuit 25 is tuned i. e. 716.67 kc. The high alternating potential side of circuit 25 is connected to the junction of condensers 41 and 42, which are preferably equal in magnitude. The opposite ends of coil 40 are connected to respective anodes of the pair of opposed diodes 43 and 44. The cathodes of the opposed diodes are connected to ground for high frequency alternating currents by condenser 45.

Load resistor 46 shunts the space current path of diode 43, and load resistor 47 shunts the space current path of diode 44. The audio frequency voltage is taken off from the cathode end of resistor 46. In general, it can be stated that when the FM oscillatory energy developed across circuit 25 has an instantaneous frequency of 716.67 kc., there will be developed equal rectified voltages across resistors 46 and 47. Since these voltages are of opposite polarity with respect to ground, the instantaneous output at that frequency will be zero. However, as the applied FM energy deviates or swings from the mean frequency of 716.67 kc., the net rectified voltage at the cathode end of resistor 46 will vary in magnitude and polarity in accordance with the extent and direction of the aforesaid frequency deviation or swing. It is to be clearly understood that the specific Koch circuit shown herein may be replaced by the circuit shown in the aforesaid Seeley patent, or by any other suitable discriminator circuit.

It is likewise apparent that intermediate frequencies other than the 4.3 mc. value can be used. In the receiving system of this invention, the received FM signal does not pass through the receiving system to the discriminator section in the conventional manner. The tubes 9 and 20 produce oscillations whether or not signals are being received, and the only effect of a received signal is to shift the frequencies of the cascaded locked-in oscillators in accordance with the modulation thereby causing the frequency of the voltage applied to the discriminator to vary in accordance with the modulation of the received signal but with a greatly reduced frequency swing. If oscillations are not produced by the oscillators the system is inoperative to receive signals, inasmuch as energy at the intermediate frequency impressed on the grid 13 cannot pass through tubes 9 and 20, and even if it could the selective circuits 40 and 25 designed to operate at mean frequencies of 1/6 I. F. could not respond to the signal I. F.

By the use of the circuits described above, satisfactory lock-in of the cascade oscillator over a minimum range of ±125 kc. has been obtained with a signal potential applied to control grid 1' of approximately 0.0015 volt. This results in from 10 to 20 volts audio output from the FM detector. It will be noted that this voltage gain is obtained at frequencies which differ from either that of the radio frequency or intermediate frequency circuits. This contributes materially to the overall stability of the receiver as previously discussed. Since one of the major problems in frequency modulation receivers is to obtain high sensitivity or gain with stability, and since the gain which can be obtained with reasonable precautions at any specific frequency is definitely limited, the additional gain obtained at a considerably lower frequency is important.

Another advantage of the present receiving system, which has also been described in the aforesaid Beers patent, is that because the discriminator operates at a much lower frequency than in conventional receivers, the circuit constants can be more readily controlled since the frequency band over which the circuits operate is correspondingly reduced. Also my invention retains in important degree the improved adjacent channel selectivity obtained by the Beers arrangement. In a conventional frequency modulation receiver, the adjacent channel selectivity is determined by the response curves of the radio frequency, intermediate frequency and discriminator circuits. If the signal on the channel adjacent to a desired signal is sufficiently strong to produce a voltage of a certain value at the discriminator-rectifier network, interference with the desired signal will be obtained even though the frequency deviations of the undesired signal do not operate over the useful portion of the discriminator characteristic. In the receiver of this invention the only signal which reaches the discriminator is represented by the frequency variations in the voltages produced by the cascade locked-in oscillator. It is desirable in a receiver as shown in Fig. 1 that the oscillators 9 and 20 be locked in with the intermediate frequency wave over the full range of 100% modulation, but by limiting the lock-in range of my cascade oscillator to the useful band width of the discriminator characteristic and to the expected frequency variations of the received wave under various conditions of operation the selectivity of the receiver is materially increased without resorting to the use of additional selective circuits. However, as previously indicated, I prefer to employ a lock-in range of adequate width to guard against mistuning with mechanical and/or remote tuners, to help overcome frequency drift due to temperature and humidity changes, and to allow for any likely degree of over-modulation at the transmitter.

Figure 2:
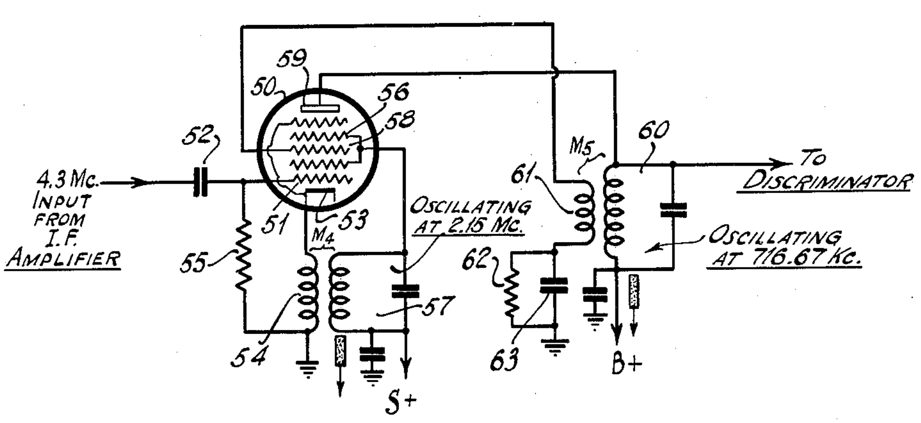
Fig. 2 is a circuit diagram illustrating a modified form of locked-in oscillator.
Figure 3:
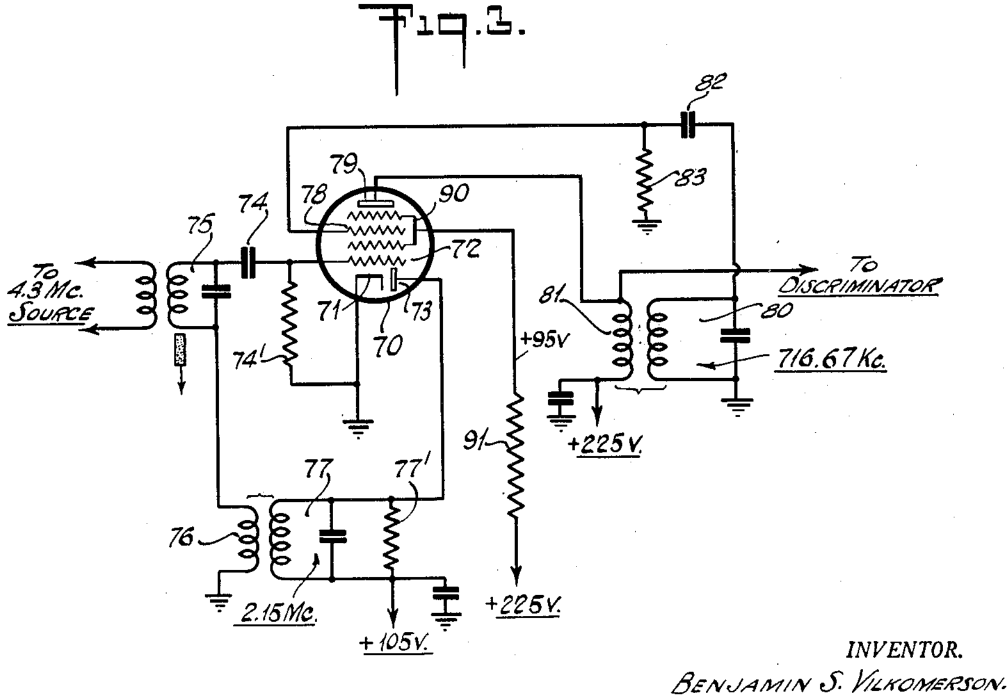
Fig. 3 shows a further modification of the circuit of Fig. 2.

While I do not desire to limit the invention to the following table of constants, the latter is given to enable those skilled in the art of FM reception most readily to construct a receiver in accordance with my invention:

$C_{14}$=91 micromicrofarads (mmf.)
$C_{22}$=3.4 mmf.
$C_{28}$=0.01 mfd.
$C_{34}$=330 mmf.
$C_{41}$, $C_{42}$=270 mmf. each
$R_{100}$=2.2 kilo-ohms
$R_{6}$=15 kilo-ohms
$R_{16}$=1 megohm
$R_{15}$=390 kilo-ohms
$R_{19}$=82 kilo-ohms
$R_{29}$=56 kilo-ohms
$R_{30}$=3 kilo-ohms
$R_{33}$=18 kilo-ohms
$R_{31}$=2.2 kilo-ohms
$R_{46}$, $R_{47}$=100 kilo-ohms each The functions of the cascaded local oscillator tubes of Fig. 1 may be performed with a single tube. Figs. 2 and 3 show respectively different embodiments of such single tube systems. In Fig. 2 tube 50 may be a pentagrid type tube whose first grid 51 is connected by coupling condenser 52 to a source of 4.3 mc. FM signal. The cathode 53 of tube 50 is connected to ground through coil 54, and resistor 55 returns grid 51 to the grounded end of cathode coil 54. The second and fourth grids are tied together to function as a single electrode 56. The latter acts as the anode of an oscillator whose tank circuit 57 is connected between a suitable point S+ of positive potential and the electrode 56. The coil 54 is regeneratively coupled, as by inductive coupling $M_4$, to tank circuit 57. Tank circuit 57 is tuned to the second subharmonic frequency, 2.15 mc., of the input frequency of 4.3 mc. The application of I. F. energy at 4.3 mc. to the grid 51 causes lock-in of the oscillations of 2.15 mc.

The second locked-in oscillator section of tube 50 comprises cathode 53, the third grid 58 and plate 59. Grid 58 is located between the elements of electrode 56, and, therefore, electrode 56 acts as a positive screen for oscillator grid 58. The plate 59 is connected to a suitable positive voltage point B+ through the coil of tank circuit 60. The latter is tuned to the third subharmonic (716.67 kc.) frequency of 2.15 mc. Grid 58 is connected to the upper end of coupling coil 61, while the lower end thereof is connected to ground through grid return resistor 62 shunted by condenser 63. The coil 61 and tank circuit 60 are inductively coupled, as at $M_5$, to provide oscillations at 716.67 kc. The locked-in oscillations developed at circuit 60 may be transmitted to the following discriminator section in the manner shown in Fig. 1.

The system of Fig. 2 acts in the following manner: Cathode 53, grid 51 and screen electrode 56 cooperate to provide the elements of a triode locked-in oscillator operating at 2.15 mc. The 4.3 mc. signal voltage being in series with the voltage induced in tickler coil 54 between cathode and grid 51, the 4.3 mc. signal locks in the 2.15-mc. oscillations. A virtual cathode is formed between the portion of grid 56 nearest the cathode and grid 58. This virtual cathode, grid 58, screen 56, the suppressor grid and plate 59 form the equivalent of a pentode, which, by virtue of coupling $M_5$, acts as the second locked-in oscillator operating at 716.67 kc. The coupling of the second oscillator to the first is due to the modulation of the virtual cathode by the first oscillator, i. e., by electron coupling and also by capacity between electrodes in the respective oscillator sections. Otherwise, the functioning of the system of Fig. 2 is the same as in the two-tube cascaded system of Fig. 1.

The modification shown in Fig. 3 employs tube 70, which may take the form of a 6A8 type of tube or any other form providing an auxiliary anode in addition to the main anode. The cathode 71, first grid 72 and second electrode (auxiliary anode rod in the 6A8) 73 cooperate to provide the first locked-in oscillator section. The 4.3 mc. signals are applied to the resonant input circuit 75, whose high alternating potential side is coupled to control grid 72 by condenser 74. The grid return resistor 74′ connects grid 72 back to ground. The low potential side of circuit 75 is connected to ground through coupling coil 76. The latter is regeneratively coupled to resonant tank circuit 77 which is tuned to 2.15 mc. The tank circuit is included in circuit with the oscillator anode electrode 73, and the latter is shown connected to a point of positive potential of +105 volts. The I. F. signals applied to grid 72 from input circuit 75 act to lock in the locally-produced oscillations of 2.15 mc.

The second locked-in oscillator section comprises cathode 71, the fourth grid 78 and plate 79. Plate 79 is regeneratively coupled to the tank circuit 80 by means of the inductive coupling between coil 81 and tank circuit 80. The plate 79 is connected through coil 81 to a potential point of +225 volts, while grid 78 is connected through condenser 82 to the high alternating potential side of tank circuit 80. Tank circuit 80 is tuned to 716.67 kc. to cause production of oscillations of that frequency. The grid return resistor 83 shunts condenser 82 to ground; and the high potential side of plate coil 81 may be connected to a discriminator, as, for example, disclosed in Fig. 1. The discriminator connection could, also, be taken from the ungrounded side of circuit 80. The control grid 78 is located between the positive shielding grids 90, the latter being effectively at +95 volts by virtue of the insertion of the voltage-reducing resistor 91 in the +225 volts line.

The 716.67 kc. oscillations produced in the second locked-in oscillator section of tube 70 are locked in over a ±12.5 kc. deviation range by the 2.15 mc. oscillations. The explanation given above relative to the functioning of the circuit of Fig. 2 applies equally well to Fig. 3. However, because of the availability of a separate plate for the first locked-in oscillator triode in Fig. 3, coil 54 of the system of Fig. 2 is taken out of the cathode circuit and placed directly in series with the I. F. signal input circuit. Coil 76 of Fig. 3 shows this change. Not using the screen 90 as the triode plate (unlike Fig. 2) and bringing the cathode 71 directly to ground make the tube more nearly simulate two separate tubes. In the modification of Fig. 3, only electron coupling exists between the two locked-in oscillators since electrode 90 provides a shield between them.

By way of illustration only, the following list of constants is given for an actual embodiment of the system of Fig. 3:

$C_{74}$=75 micromicrofarads (mmf.)
$C_{82}$=350 mmf.
$C_{77}$, $C_{80}$=40 mmf.
$R_{74}'$=39 kilo-ohms
$R_{83}$=18 kilo-ohms
$R_{77}'$=18 kilo-ohms It has been found that when a locked-in oscillator is used in accordance with this invention, the amplitude of the output of the oscillator is practically constant whether or not a signal is present, and regardless of the amplitude of the incoming signal. This means that there is practically no amplitude modulation (AM) in its output, and a single grounded-cathode diode associated with a discriminator network will give satisfactory performance. This is an important commercial advantage, since this makes it possible to use, as the FM detector in AM-FM receivers, the grounded-cathode diode tube which is normally employed almost universally as an AM detector. Circuits may therefore be simplified, and the cost of an extra FM detector tube may be avoided.

While I have indicated and described several systems for carrying my invention into effect, it will be apparent to one skilled in the art that my invention is by no means limited to the particular organizations shown and described, but that many modifications may be made without departing from the scope of my invention.

What I claim is:

1. In a frequency modulation receiving system, a circuit for receiving frequency modulated waves, means for supplying frequency modulated signal waves to said circuit, a demodulator, selective circuits in the input of the demodulator for converting frequency variations to amplitude variations, and means connected between said receiving circuit and said selective circuits for improving the signal to noise ratio of the system, said last-named means including a first oscillator locked in step with the signal input frequencies, said first oscillator including an amplifier having at least one control grid, means coupled to said circuit for impressing said signal waves on said control grid, and means for impressing a predetermined subharmonic frequency of said signal waves on said control grid, a second oscillator locked in step with the first oscillator output signals, said oscillators being constructed and arranged to operate over widely spaced lock-in frequency ranges, and means for coupling the output of the second oscillator to said selective circuits.

2. In a frequency modulation receiving system, an input circuit for receiving frequency modulated waves, means for supplying frequency modulated signal waves to said circuit, a demodulator, selective circuits in the input of the demodulator for converting frequency variations to amplitude variations, a first vacuum tube containing an anode, cathode and a plurality of grids, means for impressing frequency modulated signal waves from said input circuit on one of said grids, an oscillator including said anode, another of said grids, and a tank circuit containing inductance and capacity tuned to a predetermined sub-harmonic frequency of the signal frequency, means coupling said oscillator tank circuit and the input circuit for causing the oscillator to lock in with a desired frequency modulated wave over a range including, and substantially limited to the range of frequencies of such modulated wave under various, anticipatable operating conditions, a second tube containing an anode, cathode and at least two grids, means coupling the latter anode to said demodulator selective circuits, a second oscillator including the two grids of the second tube and a second tank circuit tuned to a predetermined other subharmonic frequency of the first subharmonic frequency, means applying locked-in oscillations of the first oscillator to one of the two grids of the second tube, and said demodulator selective circuits being tuned to said other subharmonic frequency.

3. In combination, a vacuum tube containing an anode, cathode and a plurality of grids, means for impressing angle modulated signal waves on one of said grids, an oscillator including said anode, another of said grids and a tank circuit connected to the anode and containing inductance and capacity, said tank circuit being tuned to a predetermined sub-harmonic frequency of the frequency of said signal waves, and means providing substantially close magnetic coupling between the oscillator tank circuit and said impressing means for causing the oscillator to lock in with a desired signal wave over a range of angle variations.

4. In an angle modulated carrier wave reciving system, a receiving circuit, means for supplying to said circuit waves modulated over a range of frequencies, a demodulator having an input network responsive to frequencies which are submultiples of the first-mentioned frequencies and having a pass band of a width bearing substantially the same ratio to the width of said first-mentioned range of frequencies as sub-multiple frequencies bear to the first-mentioned frequencies, cascaded locked-in oscillation-producing means interposed between the receiving circuit and said demodulator input network, said cascaded oscillation-producing means including a tube having a control grid on which said waves are impressed, and means for impressing energy at a predetermined sub-multiple of said first mentioned frequencies, said cascaded oscillation-producing means impressing voltages on the demodulator input network at frequencies which are sub-multiples of the first-mentioned frequencies and which vary over a correspondingly reduced frequency range, and means including said means for impressing for causing the separate oscillation-producing means to lock in with a desired modulated wave at different predetermined sub-multiple frequencies.

5. In a frequency modulated carrier wave receiving system, a receiving circuit, means for supplying to said circuit signal waves modulated over a range of frequencies, a demodulator having an input network responsive to frequencies which are sub-multiples of the first mentioned frequencies and having a pass band of a width bearing substantially the same ratio to the width of said first-mentioned range of frequencies as said sub-multiple frequencies bear to the first-mentioned frequencies, a vacuum tube interposed between the receiving circuit and said demodulator input network, and said tube having a pair of oscillator sections employing the common electron stream of the tube, one oscillator section including a first tank circuit tuned to a first sub-multiple frequency of the signal waves, the second oscillator section including a separate tank circuit tuned to a different sub-multiple frequency of the first sub-multiple frequency, said demodulator input network being tuned to the frequency of said second oscillator tank circuit.

6. In a frequency modulation receiving system of the type comprising a receiving circuit for waves modulated over a range of frequencies, means for reproducing the received signals, and means for discriminating in favor of a desired signal and against interfering noise and undesired signals; the improvement in said last means which comprises cascaded separate locked-in oscillators tuned to different sub-multiple frequencies, said oscillators each being constructed and arranged to operate over widely spaced lock-in ranges one of said oscillators including an amplifier having input and output electrodes, means coupling said circuit to said input electrodes for impressing said received signals thereon, and means regeneratively coupled to said amplifier for further impressing energy at a predetermined one of said sub-harmonic frequencies on said input electrodes.

7. In a frequency modulation receiving system, a circuit for receiving waves modulated over a range of frequencies, means for reproducing the received signals, and interference preventing devices comprising a first oscillation-producing means constructed and arranged to lock in at a predetermined submultiple of the frequency of the desired modulated wave and over a predetermined range of frequencies, said first oscillation-producing means including an amplifer having at least one control grid, means coupled to said circuit for impressing said modulated wave on said control grid, and means for impressing said predetermined sub-multiple frequency on said control grid, and means for amplifying the output and reducing the susceptability to noise pulses of the oscillation-producing means comprising a second oscillation-producing means constructed and arranged to lock in at a different sub-multiple frequency with the output of the first oscillation-producing means over a widely spaced frequency range.

8. In a locked-in oscillator system, a tube having a cathode, anode and at least three auxiliary electrodes, a first tank circuit regeneratively coupling the cathode and two of said auxiliary electrodes to provide a first oscillator, means for applying frequency-variable waves to said first oscillator, said tank circuit being tuned to a desired sub-multiple frequency of the mean frequency of said waves, a second tank circuit regeneratively coupling the cathode, anode and the third auxiliary electrode of the tube to provide a second oscillator, and means for tuning the second tank circuit to a desired different sub-multiple frequency of said first sub-multiple frequency.

9. In combination, a vacuum tube containing an anode, cathode and a plurality of grids, means for capacitatively impressing angle modulated signal waves on one of said grids, a locked-in oscillator including said anode, a second of said grids and a tank circuit connected to the anode and containing inductance and capacity, said tank circuit being tuned to a predetermined subharmonic frequency of the frequency of said signal waves, means providing magnetic coupling between the oscillator grid and said impressing means, the alternating voltage on said two grids being in phase, and said two grids providing a double control of the space current thereby to improve lock-in sensitivity.

10. In a frequency modulation receiving system of the type comprising a circuit for receiving frequency modulated waves, means for supplying frequency modulated signal waves to said circuit, a demodulator, selective circuits in the input of the demodulator for converting frequency variations to amplitude variations, and connections between said receiving circuit and said selective circuits, said connections including means for increasing the selectivity of the system; the improvement which includes said last-named means comprising a first relatively weak oscillation-producing means locked in step with a desired frequency modulated wave over a range of frequency variations, and a second relatively strong oscillation-producing means locked in step with the oscillatory output of the first oscillation-producing means each of said oscillation-producing means including an amplifier having input and output electrodes, means for impressing said desired frequency modulated wave to said input electrodes, and means regeneratively coupled to said amplifier for further impressing energy at a sub-harmonic of said wave on said input electrodes.

11. A system for amplifying angle-modulated wave energy which achieves high sensitivity and gain with inherent stability, said system comprising a plurality of cascaded locked-in oscillators, a first one of said oscillators being operative at small amplitudes and at a frequency which is a low, integral, subharmonic of the wave mean frequency thereby to provide high sensitivity and gain, said first one of said oscillators comprising a tube having a cathode, an anode and at least two control grids, means for impressing said wave energy on one of said grids, a resonant circuit tuned to said low sub-harmonic frequency and coupled to both of said grids and to said anode to impress energy at said low sub-harmonic frequency on both of said grids, and at least one succeeding one of said locked-in oscillators being operative at a higher amplitude and at a frequency which is a higher order sub-harmonic of said wave mean frequency, said last named oscillator stage being so designed as to harmonic content and so far removed in means frequency from the wave input frequency that the only possible feedback from said succeeding oscillator to said one oscillator is from weak, high-order relatively easily controlled harmonics of said sub-harmonic mean frequency as compared with feedback of fundamental frequency output of amplitude modulated amplifiers, thereby to secure stability.

12. A system for amplifying angle-modulated wave energy which achieves high sensitivity and gain with inherent stability, said system comprising successive locked-in oscillators, a first one of said oscillators being operative at small amplitudes and at a frequency which is a low, integral, sub-harmonic of the wave mean frequency thereby to provide high sensitivity and gain, said first one of said oscillators comprising a tube having a cathode, an anode and at least two control grids, means for impressing said wave energy on one of said grids, a resonant circuit tuned to said low sub-harmonic frequency and coupled to both of said grids and to said anode to impress energy at said low sub-harmonic frequency on both of said grids, said successive locked-in oscillators being respectively operative at frequencies which are successively of higher order sub-harmonics of said wave mean frequency, said successive oscillators each being so designed as to harmonic content and so far removed in mean frequency from the wave input frequency thereto that the only possible feedback to the first oscillator from the second one of said successive oscillators is from weak, high-order, relatively easily controlled harmonics of the respective mean sub-harmonic frequencies as compared with the feedback of fundamental output of amplitude modulated amplifiers, thereby to secure stability.

13. In a frequency modulation receiving system, an input circuit for receiving frequency modulated waves, means for supplying frequency modulated signal waves to said circuit, a demodulator, selective circuits in the input of the demodulator for converting frequency variations to amplitude variations, a first vacuum tube containing an anode, cathode and a plurality of grids, means for impressing frequency modulated signal waves from said input circuit on one of said grids, an oscillator including said anode, another of said grids, and a tank circuit containing inductance and capacity tuned to a predetermined sub-harmonic frequency of the signal frequency, means coupling the oscillator tank circuit and the input circuit for causing the oscillator to lock in with a desired frequency modulated wave over a range of frequencies of such modulated wave, the constants of said oscillator being chosen to provide relatively weak oscillations, a second tube containing an anode, cathode and at least two grids, means coupling the latter anode to said demodulator selective circuits, a second oscillator including the second tube two grids and a second tank circuit tuned to a predetermined second sub-harmonic frequency of the first sub-harmonic frequency, means applying locked-in oscillations of the first oscillator to one of the two grids of the second tube, said second oscillator providing relatively stronger oscillations, and said demodulator selective circuits being tuned to said second sub-harmonic frequency.

BENJAMIN S. VILKOMERSON.

REFERENCES CITED

The following references are of record in the file of this patent:

UNITED STATES PATENTS

| Number | Name | Date |
|---|---|---|
| 2,067,366 | Whitaker | Jan. 12, 1937 |
| 2,230,232 | Crosby | Feb. 4, 1941 |
| 2,286,356 | Foster | June 16, 1942 |
| 2,356,201 | Beers | Aug. 22, 1944 |

FOREIGN PATENTS

| Number | Country | Date |
|---|---|---|
| 460,693 | Great Britain | Feb. 2, 1937 |